United States Patent [19]
Saito

[11] Patent Number: 6,136,683
[45] Date of Patent: Oct. 24, 2000

[54] SEMICONDUCTOR DEVICE AND METHOD FOR PRODUCTION THEREOF

[75] Inventor: Minoru Saito, Tokyo, Japan

[73] Assignee: Oki Electric Industry Co., Ltd., Tokyo, Japan

[21] Appl. No.: 09/293,944

[22] Filed: Apr. 19, 1999

Related U.S. Application Data

[63] Continuation of application No. 08/925,049, Sep. 8, 1997.

[30] Foreign Application Priority Data

Apr. 15, 1997 [JP] Japan ................... 9-096283

[51] Int. Cl.[7] ............................................. H01L 21/4763
[52] U.S. Cl. ......................................... 438/622; 438/618
[58] Field of Search .................... 438/598, 618, 438/622, 652, 669, 675

[56] References Cited

U.S. PATENT DOCUMENTS

| | | | |
|---|---|---|---|
| 4,692,190 | 9/1987 | Komatsu | 437/189 |
| 5,208,658 | 5/1993 | Murata | 257/758 |
| 5,918,146 | 6/1999 | Yamashita | 438/631 |
| 6,004,887 | 12/1999 | Matsuno | 438/783 |

*Primary Examiner*—Matthew Smith
*Assistant Examiner*—Renzo Rocchegiani
*Attorney, Agent, or Firm*—Jones Volentine, LLC

[57] ABSTRACT

A semiconductor device e.g. a gate array, a mask ROM or the like produced by supplementing one or more upper-layer interconnections to units selected out of those previously produced in a half-finished semiconductor device, wherein the upper-layer interconnections are connected exclusively with the selected ones of the foregoing units and are isolated from the unselected ones of the foregoing units, by a space or an insulator layer produced between the upper-layer interconnection and a layer in which conductive paths are produced for connecting the upper-layer interconnection and the foregoing units.

8 Claims, 9 Drawing Sheets

F I G. 7
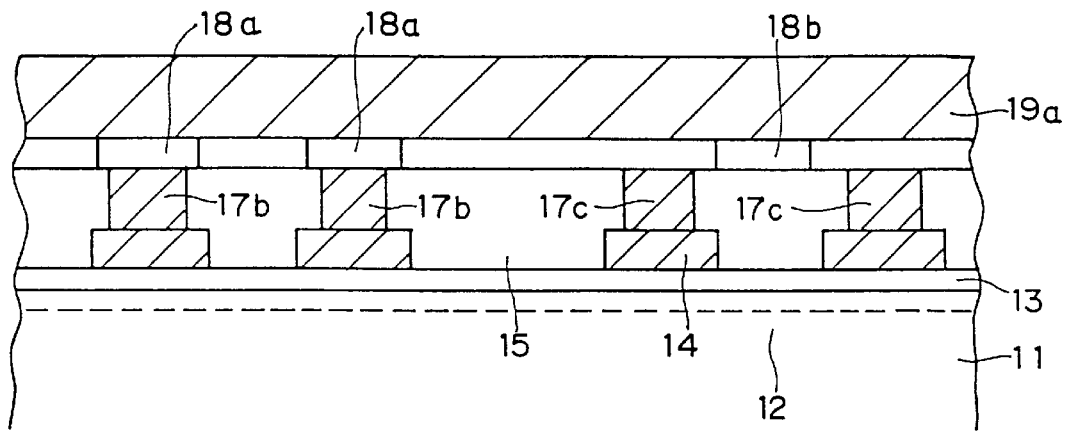
F I G. 8
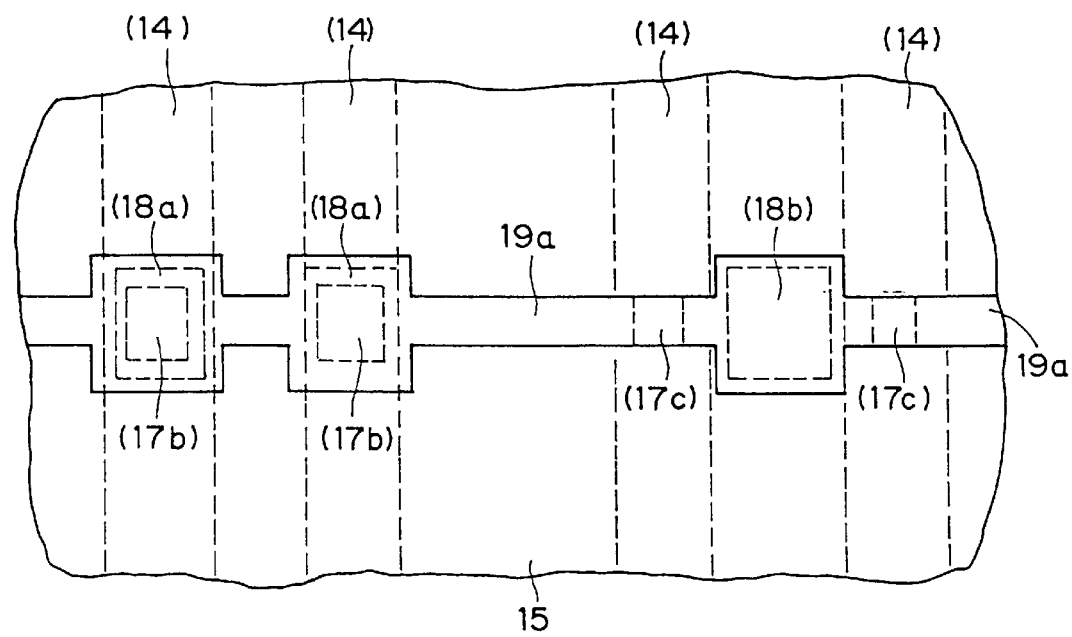

F I G. 1 1
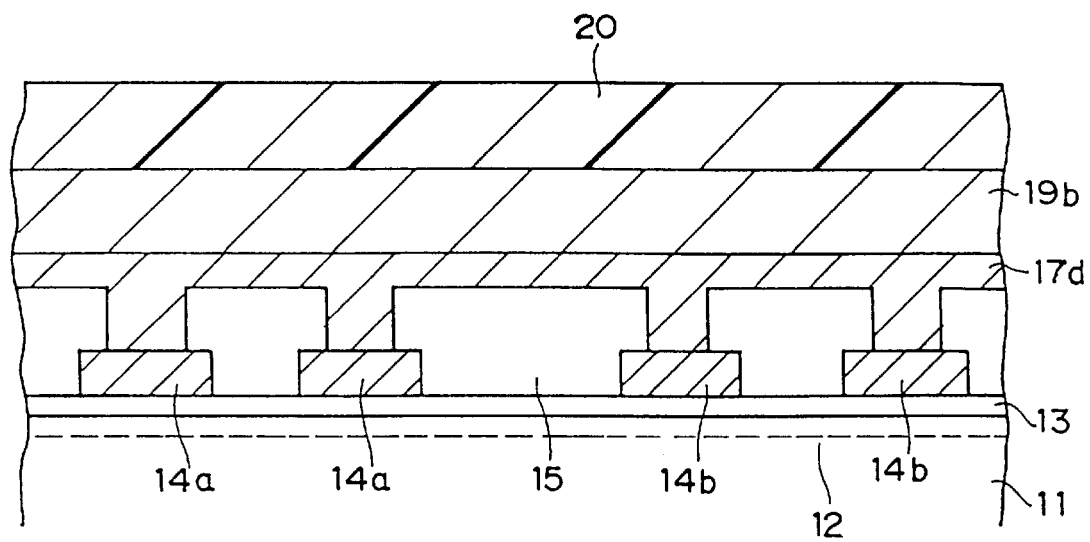
F I G. 1 2
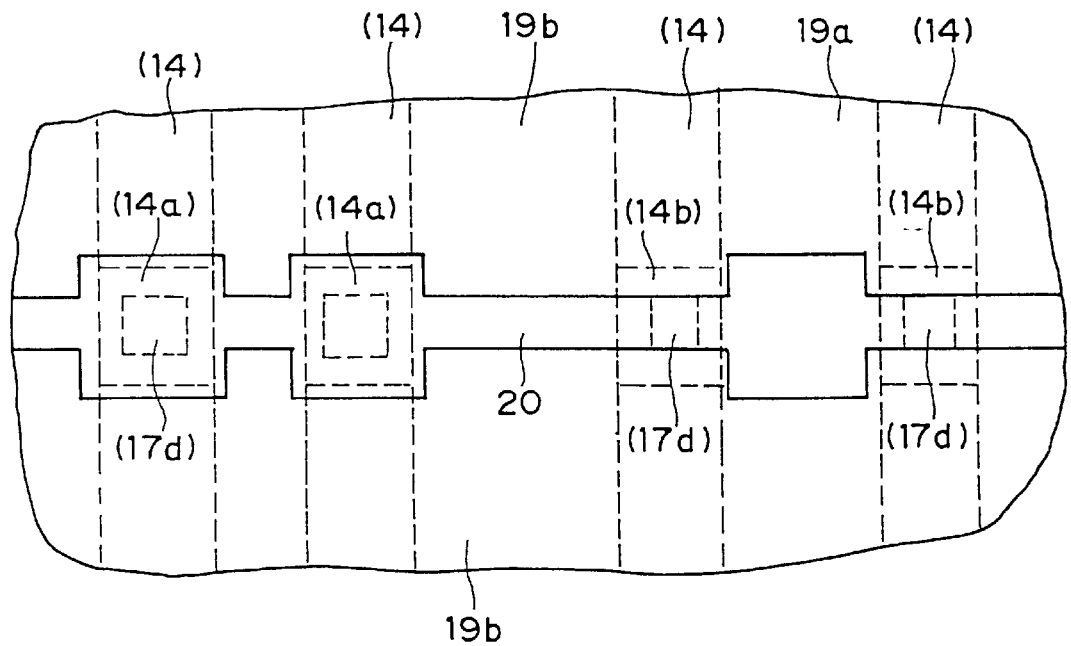

F I G. 1 5
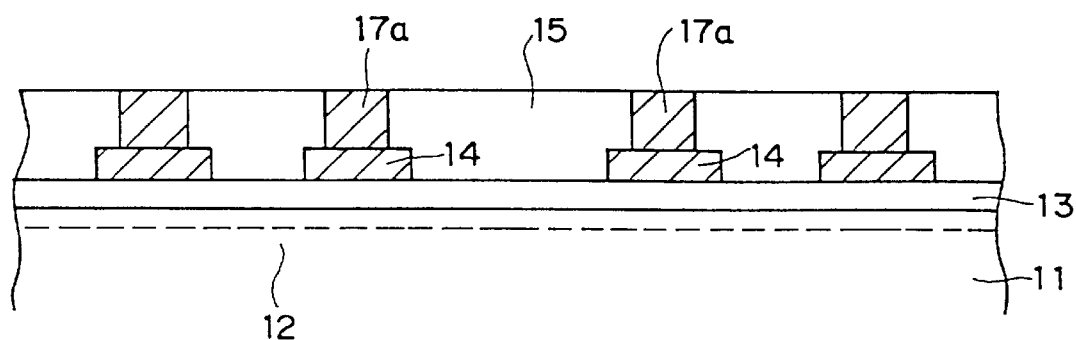
F I G. 1 6
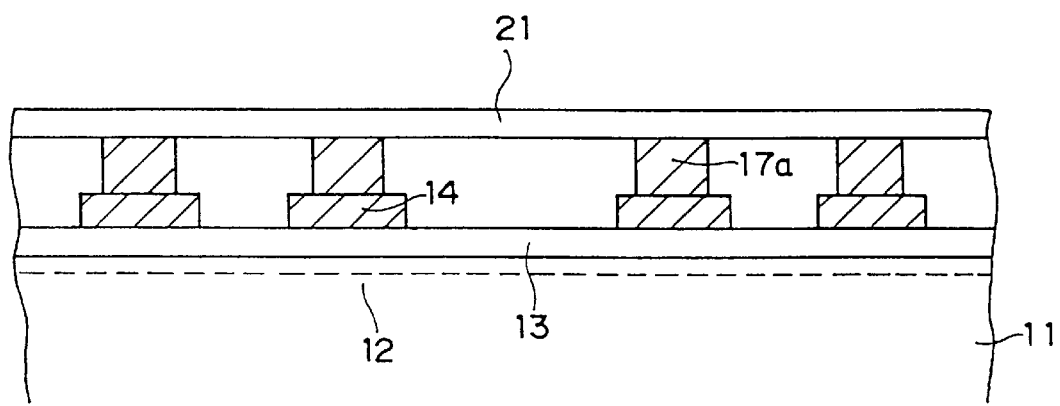

SEMICONDUCTOR DEVICE AND METHOD FOR PRODUCTION THEREOF

CROSS REFERENCE TO RELATED APPLICATIONS

This is a continuation application of application Ser. No. 08/925,049, filed Sep. 8, 1997, which is hereby incorporated by reference in its entirety for all purposes.

FIELD OF THE INVENTION

This invention relates to an improvement applicable to a semiconductor device and the like, such as a gate array, a mask ROM and the like, and to a method for production thereof. More specifically, this invention relates to an improvement applicable to multi-layer interconnections employable for a semiconductor device produced by supplementing one or more upper-layer interconnections to units selected out of those previously produced in a half-finished semiconductor device (a half-finished gate array, a half-finished mask ROM et al.) in which plural logic circuits and the wirings immediately connected thereto are produced and they are covered by an inter-layer insulator layer on which upper-layer interconnection is scheduled to be produced, and to an improvement applicable to a method for producing a multi-layer interconnection on the foregoing half-finished semiconductor device.

BACKGROUND OF THE INVENTION

Some type of semiconductor device or integrated circuit such as a gate array, a mask ROM and the like is produced by supplementing one or more upper-layer interconnections to units selected out of those previously produced in a half-finished semiconductor device (a half-finished gate array, a half-finished mask ROM et al.) in which plural logic circuits are produced and they are covered by an inter-layer insulator layer on which upper-layer interconnection is scheduled to be produced. In other words, a half-finished semiconductor device such as a half-finished gate array, a half-finished mask ROM and the like, on which plural logic circuits and the wirings immediately connected thereto have been produced but upper-layer interconnection to be connected thereto has not yet been produced is stocked, before final criteria are decided for the semiconductor device. After final criteria are decided, openings are produced to selected locations of an insulator layer which covers the wirings immediately connected to the logic circuits, the openings are buried by plug-shaped conductive pieces, and upper-layer interconnection having a horizontal shape decided following the final criteria, is produced to be connected with the plug-shaped conductive pieces. This production process has an advantage to decrease the process to be conducted after final criteria are decided and to shorten the production period to be conducted after final criteria are decided.

To meet a further requirement to further enhance the foregoing advantage, another system was developed. According to the improved system, process for production of plug-shaped conductive pieces is finished, before final criteria are decided and a process to produce upper-layer interconnection is applied only to selected plug-shaped conductive pieces, after final criteria are decided for the semiconductor device.

This improved system is involved with a drawback in which upper-layer interconnection is required to bypass the plug-shaped conductive pieces remained unselected. This is necessary to keep insulation between the upper-layer interconnection and the plug-shaped conductive pieces remained unselected which are connected monolithic electronic components e.g. transistors constituting the logic circuits produced on the semiconductor substrate.

OBJECTS AND SUMMARY OF THE INVENTION

Accordingly, the object of this invention is to provide a semiconductor device such as a gate array, a mask ROM and the like, produced by supplementing one or more upper-layer interconnections to units selected out of those previously produced in a half-finished semiconductor device (a half-finished gate array, a half-finished mask ROM et al.) in which plural logic circuits and the wirings immediately connected thereto are produced and they are covered by an inter-layer insulator layer on which upper-layer interconnection is scheduled to be produced, wherein the upper-layer interconnections are not requested to bypass the plug-shaped conductive pieces remained unselected.

The other object of this invention is to provide a method for producing the foregoing semiconductor device.

To achieve the foregoing object, a semiconductor device in accordance with a first embodiment of this invention comprising:

a semiconductor substrate on which a plurality of monolithic electronic components are produced, an insulator layer covering the semiconductor substrate, a plurality of contact pads arranged on the insulator layer and being connected the electrodes of the monolithic electronic components, an inter-layer insulator layer covering the plurality of contact pads, a plurality of plug-shaped conductive pieces penetrating the inter-layer insulator layer and being connected with the contact pad, and at least one layer of upper-layer interconnections arranged above the inter-layer insulator layer and being connected with selected ones of the plug-shaped conductive pieces, wherein the at least one layer of the upper-layer interconnections is connected with the selected ones of the plug-shaped conductive pieces through a connection pad, and the at least one layer of the upper-layer interconnections does not contact the top surface of the inter-layer insulator layer, remaining a space between the lower surface of the upper-layer interconnection and the top surface of the inter-layer insulator layer.

To achieve the foregoing object, a semiconductor device in accordance with a second embodiment of this invention comprising:

a semiconductor substrate on which a plurality of monolithic electronic components are produced, an insulator layer covering the semiconductor substrate, a plurality of contact pads arranged on the insulator layer and being connected the electrodes of the monolithic electronic components, an inter-layer insulator layer covering the plurality of contact pads, a plurality of plug-shaped conductive pieces penetrating the inter-layer insulator layer and being connected with the contact pad, and at least one layer of upper-layer interconnections arranged above the inter-layer insulator layer and being connected with selected ones of the plug-shaped conductive pieces, wherein the at least one layer of upper-layer interconnections is isolated from the unselected ones of the plug-shaped conductive pieces by an insulator layer arranged between the upper-layer and the inter-layer insulator layer.

To achieve the foregoing other object, a method for producing a semiconductor device in accordance with a first embodiment of this invention comprising:

a step for producing a half-finished semiconductor device further comprising a semiconductor substrate on which plural monolithic electronic components are produced, an insulator layer covering the semiconductor substrate, a plurality of contact pads arranged on the insulator layer and being connected the electrodes of the monolithic electronic components, an inter-layer insulator layer covering the plurality of contact pads, and a plurality of plug-shaped conductive pieces penetrating the inter-layer insulator layer and being connected with the contact pad, a step for producing a layer of a material which is conductive and accepts an etching process, produced on the inter-layer insulator and a conductive layer produced on the layer of a material which conductive and accepts an etching process, the foregoing two steps being conducted, before criteria are not yet decided for the semiconductor device, a step for producing an etching mask of which the horizontal width is larger at locations corresponding to the selected ones of the plug-shaped conductive pieces than at locations corresponding to the unselected ones of the plug-shaped conductive pieces, a step for etching the conductive layer and the layer of a material which is conductive and accepts an etching process by employing the etching mask, for producing an upper layer interconnection having a horizontal shape decided following criteria of the semiconductor device, out of the conductive layer and connection pads exclusively connected with the selected ones of the plug-shaped conductive pieces out of the layer of a material which is conductive and accepts an etching process.

In the foregoing method for producing a semiconductor device in accordance with the first embodiment of this invention, the width of the etching mask at locations corresponding to the selected ones of the plug-shaped conductive pieces is preferably approximately two times as large as the scheduled width of the upper-layer interconnection at locations corresponding to the other portions.

Further, in the foregoing method for producing a semiconductor device in accordance with the first embodiment of this invention, the plug-shaped conductive pieces and the conductive layer are preferably produced of one material and in one step.

To achieve the foregoing other object, a method for producing a semiconductor device in accordance with a second embodiment of this invention comprising:

a step for producing a half-finished semiconductor device further comprising a semiconductor substrate on which plural monolithic electronic components are produced, an insulator layer covering the semiconductor substrate, a plurality of contact pads arranged on the insulator layer and being connected the electrodes of the monolithic electronic components, an inter-layer insulator layer covering the plurality of contact pads, and plurality of plug-shaped conductive pieces penetrating the inter-layer insulator layer and being connected with the contact pad, the step being conducted, before criteria are not yet decided for the semiconductor device, a step for producing an insulator layer having openings at locations corresponding to the selected ones of the plug-shaped conductive pieces, a step for producing a conductive layer on the insulator layer, and a step for patterning the conductive layer to a horizontal shape decided following the criteria of the semiconductor device.

BRIEF DESCRIPTION OF THE DRAWINGS

This invention, together with its various features and advantages, can be readily understood from the following more detailed description presented in conjunction with the following drawings, in which:

FIG. 7 is a schematic cross-section of a finished semiconductor device in accordance with a first embodiment of this invention, FIG. 8 is schematic plan view of a finished semiconductor device in accordance with a first embodiment of this invention, FIG. 11 is a schematic cross-section of a semiconductor device in accordance with a first embodiment of this invention, under production conducted employing a method in accordance with a second mode, FIG. 12 is a schematic plan view of a semiconductor device in accordance with a first embodiment of this invention, under production conducted employing a method in accordance with a second mode, FIG. 15 is a schematic cross-section of a semiconductor device in accordance with a second embodiment of this invention, under production, FIG. 16 is schematic plan view of a semiconductor device in accordance with a second embodiment of this invention, under production.

DETAILED DESCRIPTION OF THE PREFERRED EMBODIMENTS

Referring to drawings, a detailed description will be presented for semiconductor devices e.g. gate arrays, mask ROMs or the like and methods for production thereof in accordance with two embodiments of this invention.

First Embodiment (First Production Mode)

A semiconductor device wherein the upper-layer interconnection is insulated from the plug-shaped conductive pieces remained unselected, by a lateral space remained between the upper-layer interconnection and the plug-shaped conductive pieces.

Figure 1:
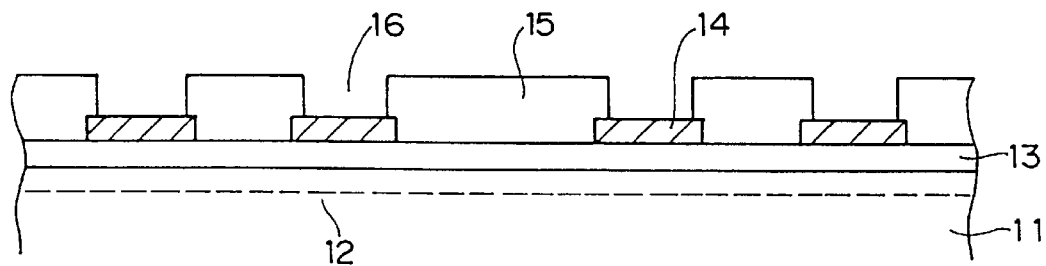
FIG. 1 is a schematic cross-section of a semiconductor device in accordance with a first embodiment of this invention, under production conducted employing a method in accordance with a first mode.

Process to be Conducted Before Criteria are Decided for the Semiconductor Device Referring to FIG. 1, plural logic circuits 12 are produced in a conductive semiconductor substrate e.g. a doped Si substrate 11. Contact pads 14 which are connection means for connecting the electrodes of the transistors constituting the logic circuits 12 and upper-layer interconnection, are produced on a field insulator layer 13. An inter-layer insulator layer 15 is produced on the field insulator layer 13. The approximate horizontal interval between the contact pads 14 is usually 3 μm. Contact holes 16 are produced to the inter-layer insulator layer 15 to expose the contact pads 14.

Figure 2:
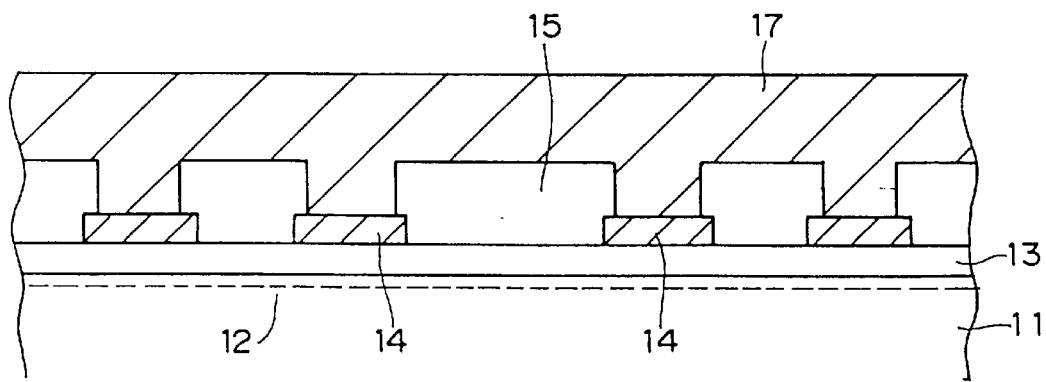
FIG. 2 is a schematic cross-section of a semiconductor device in accordance with a first embodiment of this invention, under production conducted employing a method in accordance with a first mode.

Referring to FIG. 2, a refractory metal e.g. Ti, W or the like is deposited on the inter-layer insulator layer 15 to produce a refractory metal layer 17.

Figure 3:
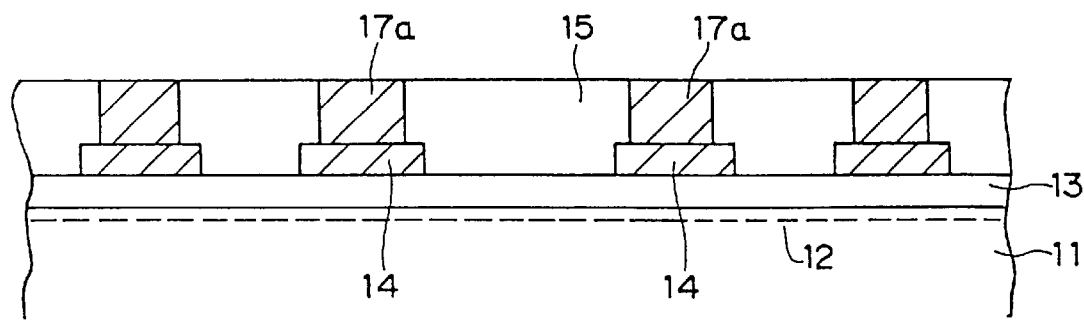
FIG. 3 is a schematic cross-section of a semiconductor device in accordance with a first embodiment of this invention, under production conducted employing a method in accordance with a first mode.

Referring to FIG. 3, a mechano chemical polishing process is conducted to remove the upper layer of the refractory metal layer 17 arranged on the inter-layer insulator layer 15, remaining plug-shaped conductive pieces 17a of the refractory metal in the contact holes 16. Since the approximate thickness of the contact pad 14 is 4,000 Å and the approximate thickness of the inter-layer insulator layer 15 is 1 μm, the approximate height of the plug-shaped conductive pieces 17a is 6,000 Å.

Figure 4:
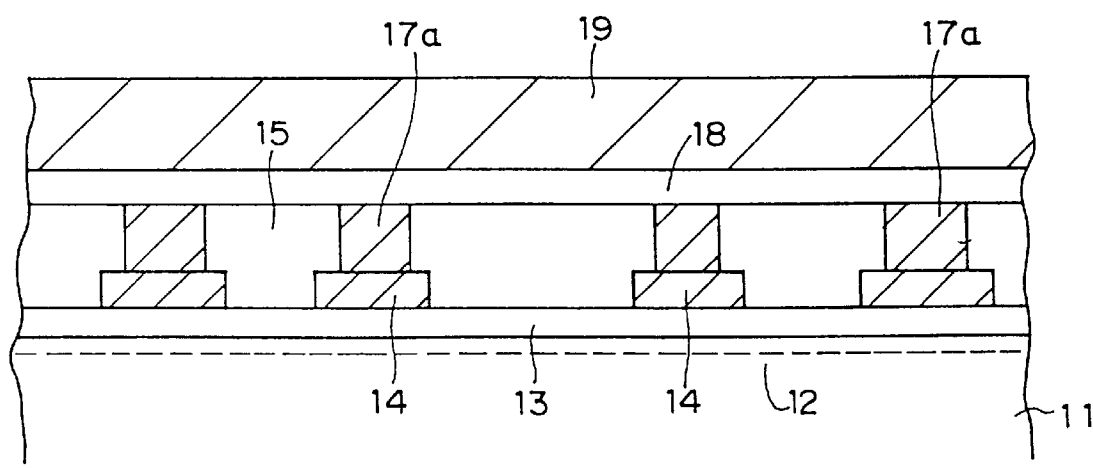
FIG. 4 is a schematic cross-section of a semiconductor device in accordance with a first embodiment of this invention, under production conducted employing a method in accordance with a first mode.

Referring to FIG. 4, a thin layer of a material which is conductive and accepts an etching process e.g. a doped poly crystalline Si layer 18 having an approximate thickness of 1,000 Å and a metal layer e.g. an Al layer 19 having an approximate thickness of 5,000 Å are produced on the inter-layer insulator layer 15.

In this manner, a half-finished semiconductor device is produced.

Figure 5:
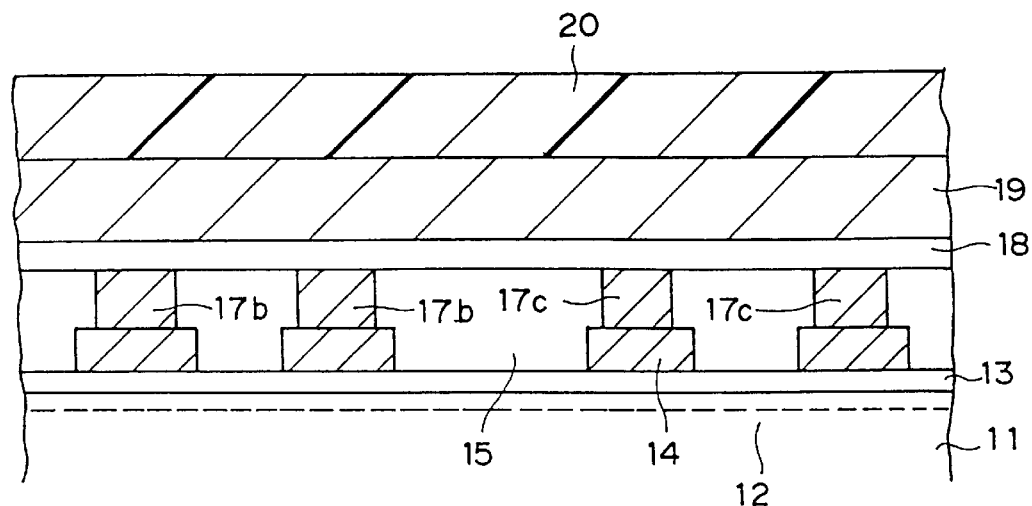
FIG. 5 is a schematic cross-section of a semiconductor device in accordance a first embodiment of this invention, under production conducted employing a method in accordance with a first mode.
Figure 6:
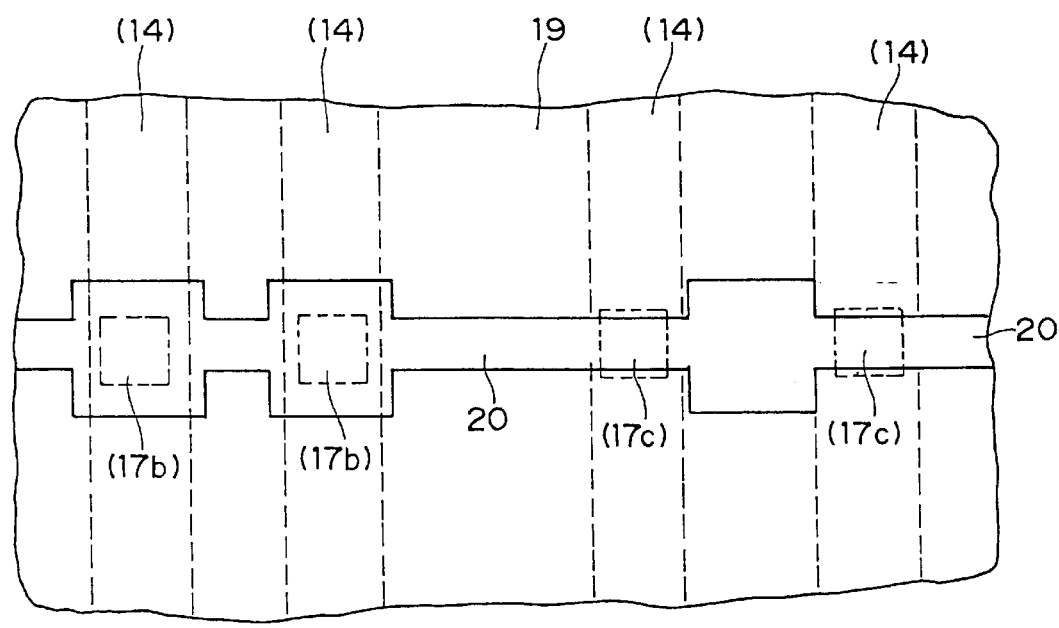
FIG. 6 is a schematic plan view of a semiconductor device in accordance with a first embodiment of this invention, under production conducted employing a method in accordance with a first mode.

Process to be Conducted After Criteria are Decided for the Semiconductor Device Referring to FIGS. 5 and 6, a photoresist layer 20 is spin coated on the metal layer 19 and is exposed by employing a photomask having the horizontal shape of upper-layer interconnection to be produced following the decided criteria of the semiconductor device. Thereafter, the photoresist layer 20 is developed to produce an etching mask 20. It is important that the horizontal width of the etching mask 20 at locations corresponding to the selected plug-shaped conductive pieces 17b or the selected contact pads 14 is at least two times as large as the horizontal width of the etching mask 20 at locations corresponding to the plug-shaped conductive pieces 17c remained unselected.

In FIG. 6, the horizontal width of the etching mask 20 is inflated at the locations corresponding to the plug-shaped conductive pieces 17b selected to be connected with upper-layer interconnection which is scheduled to be produced of the metal layer 19. On the contrary, the horizontal width of the etching mask 20 remains straight at the locations corresponding to the plug-shaped conductive pieces 17c unselected to be connected with upper-layer interconnection. A portion of the mask 20 shown in the right of FIG. 6 whose width is inflated shows a part of the etching mask 20 to produce a support piece 18b illustrated in FIGS. 7 and 8, which is a pillar of the material which is conductive and accepts an etching process produced by side etching the layer 18 of the material which is conductive and accepts an etching process by employing an etching mask whose width is inflated for a part whose lateral span is longer from side to side than usual. The emblem 14 shows band-shaped contact pads which extend from the top to the bottom along the page of the drawing.

Referring to FIGS. 7 and 8, an etching process is conducted by employing the etching mask 20 to pattern the metal layer 19 to produce the upper-layer interconnection 19a whose horizontal shape is identical to that of the etching mask 20.

Then, an isotropic etching process conducted by employing a fluoride gas e.g. $CF_4$, $SF_6$ or the like is conducted by employing again the etching mask 20. Since the width of the etching mask 20 is so designed that the layer 18 of a material which is conductive and accepts an etching process is side etched to remain only at the locations where the width of the etching mask 20 is inflated to produce connection pads 18a and at the locations corresponding to the selected plug-shaped conductive pieces 17b and to the support pieces 18b which are pillars for supplementing the mechanical strength of the upper-layer interconnection 19a for a long span or for a portion where the interval of the selected plug-shaped conductive pieces 17b is larger than usual. In other words, the layer 18 of a material which is conductive and accepts an etching process is not remained above the unselected plug-shaped conductive pieces 17c. This means that a space is remained between the unselected plug-shaped conductive pieces 17c and the upper-layer interconnection 19a.

Produced in this manner is a structure in which upper-layer interconnections 19a are insulated from the plug-shaped conductive pieces 17c remained unselected, by a lateral space which intervenes therebetween. Thus, the upper-layer interconnections 19a are connected only with the selected plug-shaped conductive pieces 17b through the connection pads 18a of a conductive material such as doped ploy crystalline Si, although the top surface of the plug-shaped conductive pieces 17c remained unselected faces a space.

First Embodiment (Second Production Mode)

A semiconductor device wherein the upper-layer interconnection is insulated from the plug-shaped conductive pieces remained unselected, by a lateral space remained between the upper-layer interconnection and the plug-shaped conductive pieces, the lateral space being produced by removing conductive layer which was produced in one body with the plug-shaped conductive pieces.

Figure 9:
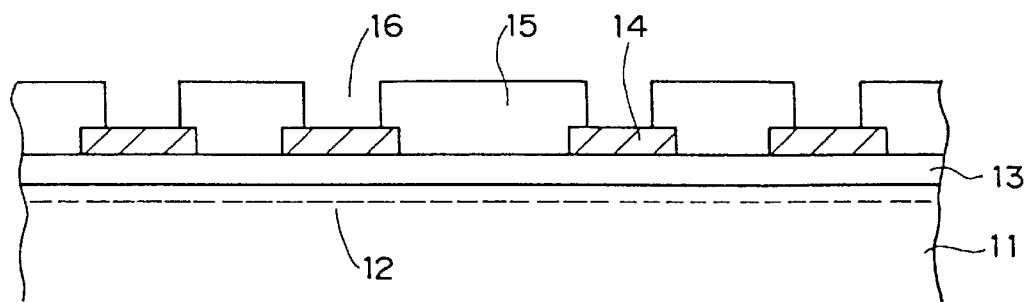
FIG. 9 is a schematic cross-section of a semiconductor device in accordance with a first embodiment of this invention, under production conducted employing a method in accordance with a second mode.

Process to be Conducted Before Criteria are Decided for the Semiconductor Device Referring to FIG. 9, plural logic circuits 12 are produced in a conductive semiconductor substrate e.g. a doped Si substrate 11. Contact pads 14 which are connection means for connecting the electrodes of the transistors constituting the logic circuits 12 and upper-layer interconnection, are produced on a field insulator layer 13. An inter-layer insulator layer 15 is produced on the field insulator layer 13. The approximate interval between the contact pads 14 is usually 3 μm. Contact holes 16 are produced to the inter-layer insulator layer 15 to expose the contact pads 14.

Figure 10:
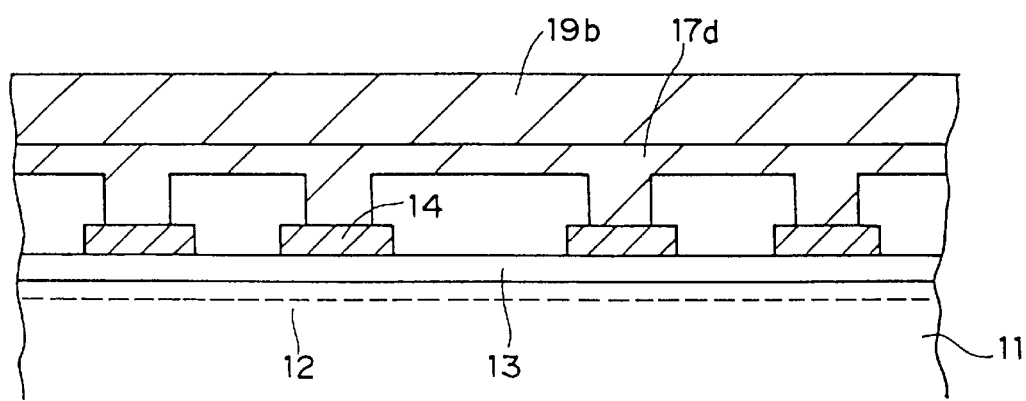
FIG. 10 is a schematic cross-section of a semiconductor device in accordance with a first embodiment of this invention, under production conducted employing a method in accordance with a second mode.

Referring to FIG. 10, a refractory metal e.g. Ti, W or the like is deposited on the inter-layer insulator layer 15 to produce a refractory metal layer 17d having an approximate thickness of 1,000 Å on the inter-layer insulator layer 15. A layer 19b of a metal which is conductive and is allowed to be employed as an etching mask for an etching process to be conducted to etch the layer of a refractory metal 17d is produced on the layer of a refractory metal 17d. An exemplary material of the layer 19b is aluminum. The thickness of the layer 19b is approximately 5,000 Å.

In this manner, a half-finished semiconductor device is produced.

Process to be Conducted After Criteria are Decided for the Semiconductor Device

Referring to FIGS. 11 and 12, a photoresuit layer 20 is spin coated on the layer 19b and is exposed by employing a photomask having the horizontal shape of upper-layer interconnection to be produced following the decided criteria of the semiconductor device. Thereafter, the photoresist layer 20 is developed to produce an etching mask 20. It is important that the horizontal width of the etching mask 20 at locations corresponding to the contact pads 14a selected to be connected the upper layer interconnection 19c is at least two times as large as the width of the etching mask 20 at locations corresponding to the contact pads 14b remained unselected.

In FIG. 12, the width of the etching mask 20 is inflated at locations which are first and second from the left and a location which is second from the right. The former locations correspond to the selected contact pads 14a and the latter location corresponds to a support piece 17h illustrated in FIGS. 13 and 14 to supplement the mechanical strength for a long span, which was discussed earlier for the first production mode. The width of the etching mask 20 remains straight at locations corresponding to the unselected contact pads 14b. The emblem 14 shows band-shaped contact pads which extend from the top to the bottom along the page of the drawing.

Figure 13:
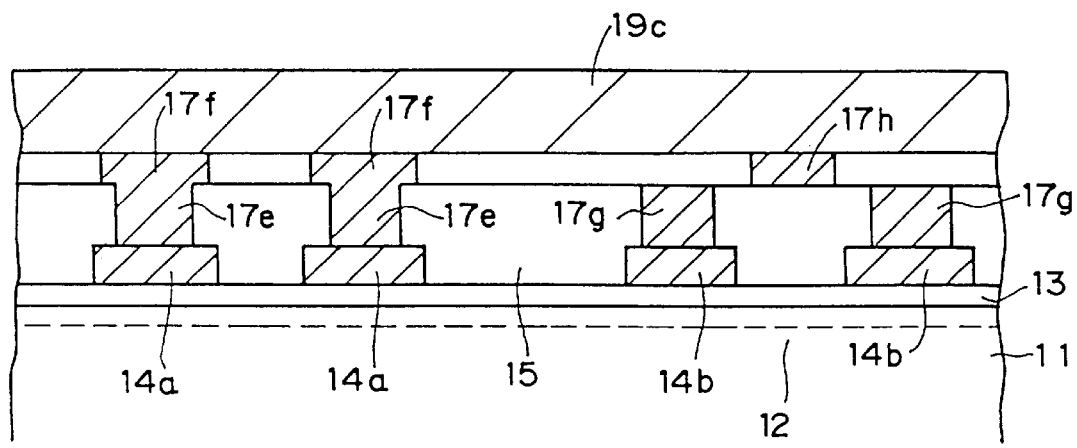
FIG. 13 is a schematic cross-section of a finished semiconductor device in accordance with a first embodiment of this invention.
Figure 14:
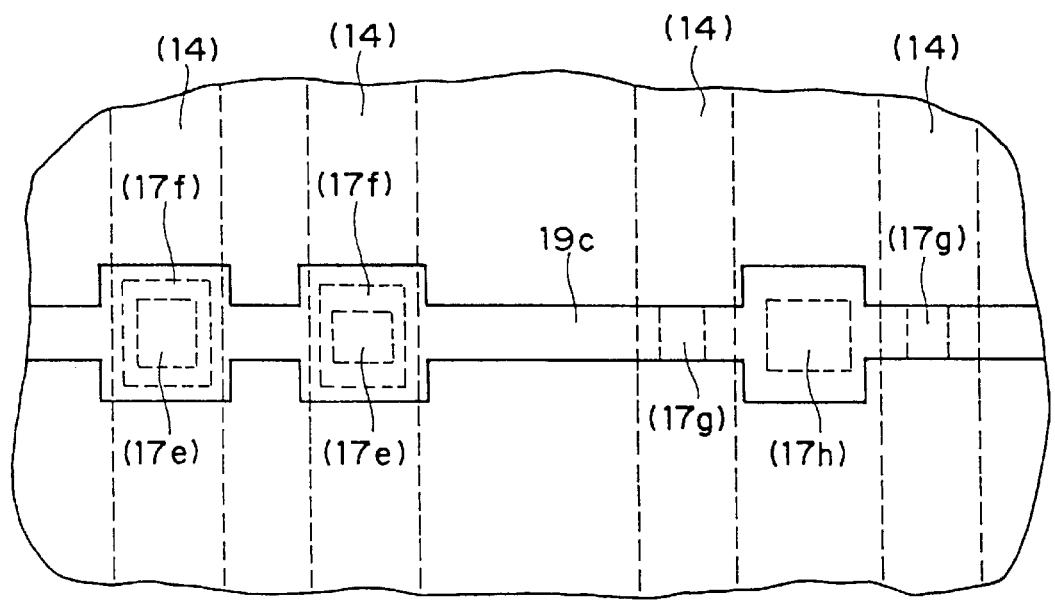
FIG. 14 is schematic plan view of a finished semiconductor device in accordance with a first embodiment of this invention.

Referring to FIGS. 13 and 14, an etching process is conducted by employing the etching mask 20 to pattern the metal layer 19b to produce the upper-layer interconnection 19c whose horizontal shape is identical to that of the etching mask 20.

Then, an isotropic etching process conducted by employing a fluoride gas e.g. $CF_4$, $SF_6$ or the like is conducted by employing again the etching mask 20. The refractory metal layer 17d is remained in the contact holes 16. The refractory metal layer 17d remained in the contact holes 16 at the locations corresponding to the selected contact pads 14a is converted to plug-shaped conductive pieces 17e and the refractory metal layer 17d remained in the contact holes 16 at the locations corresponding to the unselected contact pads 14b is converted to refractory metal pillars 17g.

On the other hand, since the width of the etching mask 20 is so designed that the refractory metal layer 17d is side etched to remain only at locations corresponding to the selected contact pads 14a and to the support pieces 17h discussed above. The refractory metal layer 17d remained above the plug-shaped conductive piece 17e is converted to a connection pad 17f which actually is made in one body combined with the plug-shaped conductive piece 17e. In other words, at the locations corresponding to the unselected contact pads 14b, the refractory metal layer 17d is remained only in the contact holes 16 to produce the refractory metal pillars 17g. In this manner, a space is remained above the refractory metal pillars 17g which is located on the contact pads unselected 14b.

Produced in this manner is a structure in which upper-layer interconnections 19c are insulated from the unselected contact pads 14b, by a lateral space which intervenes therebetween. Thus, the upper-layer interconnections 19c are connected only with the selected pads 14a through combined bodies of the plug-shaped conductive pieces 17e and the connection pads 17f.

Second Embodiment

A semiconductor device wherein the upper-layer interconnection is insulated from the plug-shaped conductive pieces remained unselected, by an insulator layer.

Process to be Conducted Before Criteria are Decided for the Semiconductor Device Referring to FIG. 15, the process identical to that described above, referring to FIGS. 1 through 3, is conducted to produce a half-finished semiconductor device.

Process to be Conductor After Criteria are Decided for the Semiconductor Device

Referring to FIG. 16, a layer of insulator e.g. $SiO_2$, $Si_3N_4$ or the like 21 of 1,000 Å thick is produced. A CVD process can be employed for this purpose.

Figure 17:
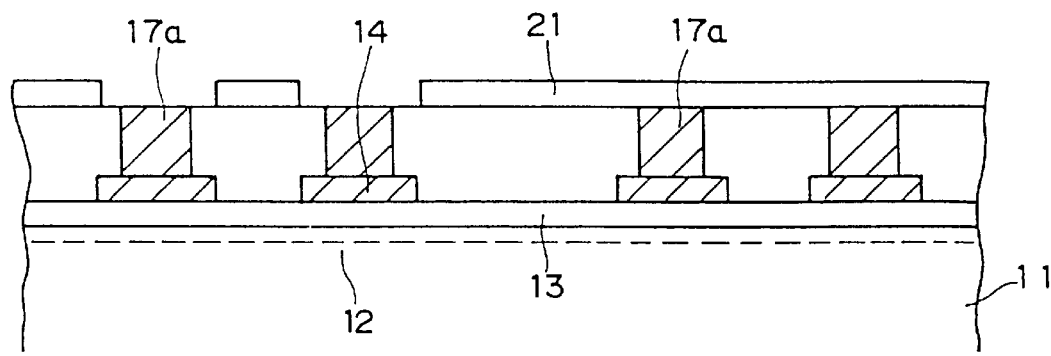
FIG. 17 is schematic plan view of a semiconductor device in accordance with a second embodiment of this invention, under production.

Referring to FIG. 17, the insulator layer 21 is removed from the locations corresponding to the plug-shaped conductive pieces 17a selected to be connected with upper-layer interconnection. The plug-shaped conductive pieces 17a unselected remain covered by the insulator layer 21. A photolithography process is employed for this purpose.

Figure 18:
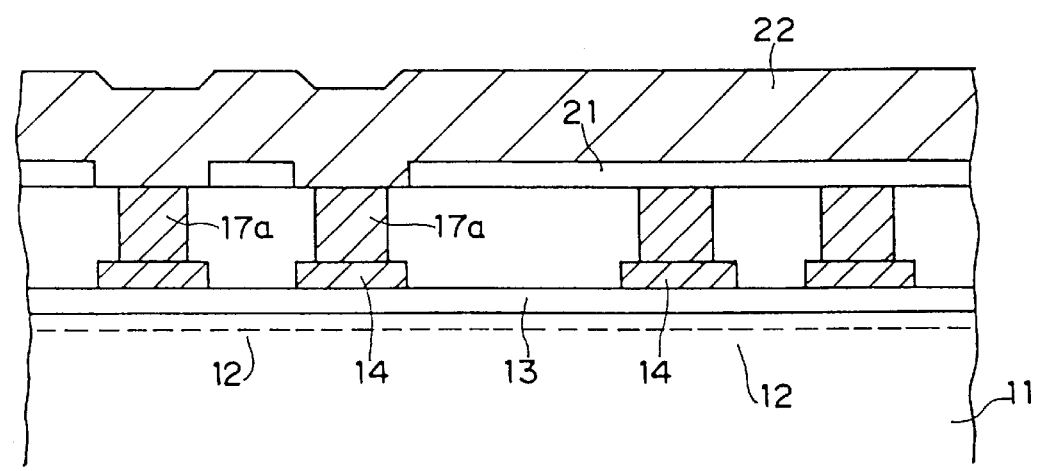
FIG. 18 is schematic plan view of a finished semiconductor device in accordance with a second embodiment of this invention.

Referring to FIG. 18, a metal layer 22 is produced on the insulator layer 21. Thereafter, the metal layer 22 is patterned into the horizontal shape of the upper-layer interconnection instructed by the criteria. A photolithography process is again employed for this purpose.

Produced in this manner is a structure in which upper-layer interconnections 22 are insulated from the unselected plug-shaped conductive pieces 17a, by an insulator layer 21 and the selected plug-shaped conductive pieces 17a above are connected with the upper-layer interconnections.

The foregoing description has clarified that a semiconductor device such as a gate array, a mask ROM and the like produced by supplementing one or more upper-layer interconnections to units selected out of those previously produced in a half-finished semiconductor device (a half-finished gate array, a half-finished mask ROM et al.) in which plural logic circuits and the wirings immediately connected thereto are produced and they are covered by an inter-layer insulator layer on which upper-layer interconnection is scheduled to be produced, wherein the upper-layer interconnections are not requested to bypass the plug-shaped conductive pieces remained unselected and a method for production thereof, are successfully provided by this convention.

Although this convention has been described with reference to specific embodiments, this description is not meant to be construed in limiting sense. Various modifications of the disclosed embodiments, as well as other embodiments of this invention, will be apparent to persons skilled in the art upon reference to the description of this invention. It is therefore contemplated that the appended claims will cover any such modifications or embodiments as fall within the true scope of this invention.

What is claimed is:

1. A method for producing a semiconductor device comprising:

producing a plurality of monolithic electronic components on a semiconductor substrate, a first insulator layer covering said semiconductor substrate, a plurality of contact pads arranged on said first insulator layer and connected to electrodes of said monolithic electronic components, a second insulator layer covering said plurality of contact pads, and a plurality of plug-shaped conductive pieces penetrating said second insulator layer and being connected with said contact pads;

producing a layer of a material which is conductive and accepts an etching process on said second insulator layer and a conductive layer produced on said layer of a material which is conductive and accepts an etching process;

producing an etching mask in accordance with a design criteria of the semiconductor device, the design criteria specifying selected ones of said plug-shaped conductive pieces, said etching mask being produced such that a horizontal width of the etching mask is larger at locations corresponding to the selected ones of said plug-shaped conductive pieces than at locations corresponding to the unselected ones of said plug-shaped conductive pieces;

using said etching mask to etch the conductive layer and the layer of a material which is conductive and accepts an etching process to connect an interconnection layer with only said selected ones of said plug-shaped conductive pieces.

2. A method for producing a semiconductor device in accordance with claim 1, wherein the horizontal width of said etching mask at locations corresponding to the selected ones of said plug-shaped conductive pieces is approximately two times as large as the horizontal width at locations corresponding to the unselected ones of said plug-shaped conductive pieces.

3. A for producing a semiconductor device in accordance with claim 1, wherein said plug-shaped conductive pieces and said connection pads are produced of one material in body in one process step.

4. A method for producing a semiconductor device comprising:

producing a plurality of monolithic electronic components on a semiconductor substrate, a first insulator layer covering said semiconductor substrate, a plurality of contact pads arranged on said first insulator layer and connected to electrodes of said monolithic electronic components, a second insulator layer covering said plurality of contact pads, and a plurality of plug-shaped conductive pieces penetrating said second insulator layer and being connected with said contact pads;

producing a third insulator layer in accordance with a design criteria of the semiconductor device, the design criteria specifying selected ones of said plug-shaped conductive pieces, the third insulator layer being produced so as to have openings at locations corresponding to the selected ones of said plug-shaped conductive pieces and so as to cover unselected ones of said plug-shaped conductive pieces;

producing a conductive layer on said third insulator layer such that said conductive layer contacts said selected ones of said plug-shaped pieces and does not contact said unselected ones of said plug-shaped pieces; and patterning said conductive layer.

5. A method for interconnecting logic circuits formed on a substrate of a semiconductor device, comprising:

forming a plurality of contact pads which are electrically connected to respective logic circuits, and forming a plurality of plugs on the plurality of contact pads, respectively; and thereafter carrying out an interconnection process in accordance with a design criteria of the semiconductor device, the design criteria specifying selected ones of said plugs formed on said respective contact pads, said interconnection process being carried out such that an interconnection layer is electrically connected to the selected ones of said plugs and is not electrically connected to unselected ones of said plugs.

6. A method as claimed in claim 5, wherein said interconnection process includes forming a mask having horizontal widths at locations of the selected ones of said plugs which are larger than horizontal widths at locations of the unselected ones of said plugs.

7. A method as claimed in claim 5, wherein said interconnection process includes forming a mask having horizontal widths at locations of the selected ones of said plugs which are approximately two times larger than horizontal widths at locations of the unselected ones of said plugs.

8. A method as claimed in claim 5, wherein said contact pads and said plugs are produced of one material in one body in one process step.

* * * * *